United States Patent
Kimura et al.

(10) Patent No.: US 9,273,414 B2
(45) Date of Patent: Mar. 1, 2016

(54) EPITAXIAL GROWTH APPARATUS AND EPITAXIAL GROWTH METHOD

(75) Inventors: Fumihiko Kimura, Tokyo (JP); Kazuhisa Iwanaga, Tokyo (JP); Takeshi Masuda, Tokyo (JP)

(73) Assignee: SUMCO Corporation, Tokyo (JP)

( * ) Notice: Subject to any disclaimer, the term of this patent is extended or adjusted under 35 U.S.C. 154(b) by 1276 days.

(21) Appl. No.: 12/945,299

(22) Filed: Nov. 12, 2010

(65) Prior Publication Data
US 2011/0114017 A1    May 19, 2011

(30) Foreign Application Priority Data
Nov. 16, 2009    (JP) ................................. 2009-260577

(51) Int. Cl.
| | |
|---|---|
| C30B 25/02 | (2006.01) |
| C30B 29/06 | (2006.01) |
| C30B 25/12 | (2006.01) |

(52) U.S. Cl.
CPC ................. *C30B 29/06* (2013.01); *C30B 25/02* (2013.01); *C30B 25/12* (2013.01)

(58) Field of Classification Search
USPC .................. 117/84, 90, 91, 104, 103
See application file for complete search history.

(56) References Cited

U.S. PATENT DOCUMENTS

| | | | | |
|---|---|---|---|---|
| 2003/0119283 | A1* | 6/2003 | Ishibashi et al. | ............... 438/478 |
| 2005/0000449 | A1* | 1/2005 | Ishibashi et al. | ............... 118/728 |
| 2008/0110401 | A1* | 5/2008 | Fujikawa et al. | ............... 118/724 |
| 2009/0314210 | A1* | 12/2009 | Ishibashi et al. | ............... 118/728 |

FOREIGN PATENT DOCUMENTS

| | | |
|---|---|---|
| JP | H04256311 A | 9/1992 |
| JP | 2000-103696 | 4/2000 |
| JP | 2000-124141 | 4/2000 |
| JP | 2000103696 A | 4/2000 |
| JP | 2009-135258 | 6/2009 |
| JP | 2009188082 A | 8/2009 |

* cited by examiner

*Primary Examiner* — Robert M Kunemund
(74) *Attorney, Agent, or Firm* — Thomas J. Engellenner; Reza Mollaaghababa; Pepper Hamilton LLP

(57) ABSTRACT

An object of the present invention is to provide an epitaxial growth apparatus and an epitaxial growth method that can suppress variation in in-face temperature of a semiconductor wafer caused by deflection of a susceptor and manufacture an epitaxial wafers of high quality. Specifically, the present invention provides an epitaxial growth apparatus for forming an epitaxial film on a semiconductor wafer placed in a chamber having a supply port and an exhaust port for a treatment gas, the apparatus comprising: a susceptor for placing the semiconductor wafer thereon within the chamber; and a susceptor support shaft for supporting the susceptor at an underneath portion of the susceptor, wherein the susceptor support shaft has a support column located substantially coaxial with the center of the susceptor, and at least four support arms extending radially from the top end of the support column with equal intervals therebetween.

14 Claims, 15 Drawing Sheets

(a)

(b)

EPITAXIAL GROWTH APPARATUS AND EPITAXIAL GROWTH METHOD

BACKGROUND OF THE INVENTION

1. Field of the Invention

The present invention relates to an epitaxial growth apparatus and an epitaxial growth method and, in particular, to improvement of a support shaft of a susceptor for supporting a semiconductor wafer during growth of an epitaxial film on the semiconductor wafer.

2. Description of the Related Art

In the field of semiconductor electronics in which products are increasingly required to exhibit high performances and high functionality, quality of an epitaxial wafer significantly influences quality of a resulting product device. An epitaxial wafer is a semiconductor wafer having an epitaxial film formed on a surface thereof by vapor phase epitaxy. A high quality epitaxial film having aligned crystal axes is formed on a surface of a semiconductor wafer in accordance with the regular sequence of atoms thereat.

There has conventionally been used in production of an epitaxial wafer a batch-process-type epitaxial growth apparatus capable of effecting epitaxial growth on plural semiconductor wafers simultaneously. However, such a batch-process-type epitaxial growth apparatus as described above cannot easily adapt to production of large-diameter semiconductor wafers. For this reason, in recent years, it is increasingly common to use a single-wafer epitaxial growth apparatus in which epitaxial growth is effected for a single semiconductor wafer individually. Recently, there has been developed a single-wafer epitaxial growth apparatus for a large-diameter semiconductor wafer, capable of handling a semiconductor wafer having a diameter of 450 mm or more.

FIG. 1 is a schematic sectional view of a conventional single-wafer epitaxial growth apparatus 200. This epitaxial growth apparatus 200 includes a chamber 201, a susceptor 202 for supporting a wafer W placed within the chamber 201, and a susceptor support shaft 203 for supporting the susceptor 202. A supply port 204 for a treatment gas is formed at a side portion of the chamber 201, and an exhaust port 205 is formed at a position of the chamber opposite to the supply port 204. Further, plural halogen lamps 206 as heating sources are radially disposed in each of an upper side region and a lower side region of the chamber 201.

FIG. 2 is a schematic exploded perspective view showing details of the susceptor 202 and the susceptor support shaft 203 described above. The susceptor support shaft 203 includes a support column 207 and support arms 208, and a protrusion 209 and a protrusion 210 for supporting the susceptor 202 are provided on the support column 207 and each support arm 208, respectively. Further, there are formed on the rear surface of the susceptor 202 a recessed portion 211 and a recessed portion 212 at positions corresponding to the protrusion 209 and the protrusion 210, respectively. In this structure, the positioning of the susceptor 202 is effected by aligning the recessed portion 211 formed at a center of the susceptor 202 with the protrusion 209 provided at the support column 207. Yet further, the recessed portions 212 are engaged with the corresponding protrusions 210, respectively, thereby preventing the susceptor 202 from making relative movement around the protrusion 209 in the rotational direction.

By using the epitaxial growth apparatus 200, the semiconductor wafer W is placed on the susceptor 202; the halogen lamps 206 are lit to heat the semiconductor wafer W; and a treatment gas including a carrier gas, a growth source gas, a dopant gas and the like are introduced from the supply port 204 while being exhausted from the exhaust port 205 simultaneously, such that the treatment gas flows in a laminar flow state along a surface of the semiconductor wafer W which has been heated to a predetermined temperature. As a result, an epitaxial film can be grown on the semiconductor wafer W.

However, in the case where the aforementioned epitaxial growth apparatus 200 is used, there arises a problem that an epitaxial film having sufficient thickness is not formed at the center portion of the semiconductor wafer W. In general, the thickness of an epitaxial film formed by epitaxial growth is affected by a temperature of the semiconductor wafer W therebelow. As described above, although the semiconductor wafer W is heated by the halogen lamps 206, heat from the halogen lamps 206 located at the lower portion of the chamber 201 cannot be transferred in a satisfactory manner because, as is obvious from FIG. 1, the rear surface of the semiconductor wafer W is heated through the susceptor 202 and there exist the support column 207 of the susceptor support shaft 203 and the protrusion 209 provided at the top end of the support column 207 at the center portion of the susceptor 202 (i.e. the center portion of the semiconductor wafer W).

In view of the facts described above, JP 2000-124141 Laid-Open discloses a technique in which the protrusion 209 is not provided at the top end of the support column 207 and the positioning of the susceptor 202 is effected by alignment of respective three pairs of the protrusions 210 and the recessed portions 212, so that the heat from the halogen lamps 206 located at the lower portion is not blocked and can reach the center portion of the semiconductor wafer W.

The temperature in the chamber 201 of the epitaxial growth apparatus 200 becomes more than 1000° C. during the epitaxial growth process, and the susceptor 202 and the susceptor support shaft 203 are exposed to such a high-temperature environment. JP 2009-135258 Laid-Open discloses a technique in which a reinforcing member (not shown) is provided to each support arm 208 of the susceptor support shaft 203, among the susceptor 202 and the susceptor support shaft 203, in order to prevent the support arm 208 from being deformed and thus supporting the susceptor 202 in a slanted manner.

JP 2000-103696 Laid-Open discloses a technique in which provision of the protrusion 209 at the top end of the support column 207 is omitted as in JP 2000-124141 and further a position at which the support arm 208 is in contact with the rear surface of the susceptor 202 is shifted toward the inner or the outer side in the radial direction than in JP 2000-124141 for the purpose of uniformly heating the susceptor 202 by the halogen lamps 206 located at the lower portion of the chamber 201.

According to the inventions of JP 2000-124141, JP 2009-135258, and JP 2000-103696 described above, the susceptor 202 can be uniformly heated and an effect of making epitaxial film thickness even is achieved to some extent. However, the effect of making epitaxial film thickness even is not yet sufficient and variation in resistivity distribution within an epitaxial film is still quite large.

As a result of a keen study to make thickness and resistivity distribution of an epitaxial film uniform, the present inventors discovered that, even in a case where the susceptor 202 is uniformly heated, the outer peripheral portion of the susceptor 202 is deflected (in the circumferential direction) due to exposure of the susceptor 202 itself to the high-temperature environment and that a magnitude of such deflection of the susceptor 202 as described is especially large at a portion which is not supported by the susceptor support shaft 203.

In a case where the epitaxial growth process is carried out in a state where the susceptor 202 has partially been deflected at the outer peripheral portion thereof, a space is created between the deflected portion of the susceptor 202 and a semiconductor wafer W placed thereon, whereby the semiconductor wafer W is partially cooled by a carrier gas or the like entering into the space and the temperature of the semiconductor wafer W varies in the circumferential direction thereof. When epitaxial growth is performed at such a surface of the semiconductor wafer W where the temperature varies as described above, the thickness of an epitaxial film grown on the wafer surface and the amount of dopant taken into the epitaxial layer also vary within the wafer surface. In short, deflection of a susceptor significantly affects the thickness distribution and the resistivity distribution of a silicon epitaxial film of an epitaxial wafer. This problem of uneven distribution of resistivity cannot be ignored, in particular, in an epitaxial wafer to which the resistivity standards must be strictly applied.

SUMMARY OF THE INVENTION

An object of the present invention is to solve the problems described above and to provide an epitaxial growth apparatus and an epitaxial growth method that can suppress variation in in-face temperature of a semiconductor wafer caused by deflection of a susceptor and manufacture an epitaxial wafer of high quality.

To achieve the object described above, a main configuration of the present invention is as follows:

(1) An epitaxial growth apparatus for forming an epitaxial film on a semiconductor wafer placed in a chamber having a supply port and an exhaust port for a treatment gas, the apparatus comprising: a susceptor for placing the semiconductor wafer thereon within the chamber; and a susceptor support shaft for supporting the susceptor at an underneath portion of the susceptor, wherein the susceptor support shaft has a support column located substantially coaxial with the center of the susceptor, and at least four support arms extending radially from the top end of the support column with equal intervals therebetween.

(2) The epitaxial growth apparatus of (1) described above, wherein the susceptor support shaft has six support arms.

(3) The epitaxial growth apparatus of (1) or (2) described above, wherein the susceptor is made of carbon graphite whose surface is coated with silicon carbide.

(4) The epitaxial growth apparatus of any of (1) to (3) described above, wherein the susceptor support shaft is made of quartz.

(5) An epitaxial growth method of forming an epitaxial film on a semiconductor wafer by using the apparatus of any one of (1) to (4) described above, comprising growing the epitaxial film such that non-uniformity of resistivity distribution at a surface of the epitaxial film is 4.0% or less.

According to the epitaxial growth apparatus and the epitaxial growth method of the present invention, the susceptor for placing the semiconductor wafer thereon is supported at the underneath portion thereof by at least four support arms of the susceptor support shaft, whereby it is possible to suppress deflection of the susceptor, decrease variation in-face temperature of the semiconductor wafer and thus produce an epitaxial wafer of high quality.

BEST MODE FOR IMPLEMENTING THE PRESENT INVENTION

An embodiment of an epitaxial growth apparatus and an epitaxial growth method according to the present invention will be described with reference to the drawings.

Figure 1:
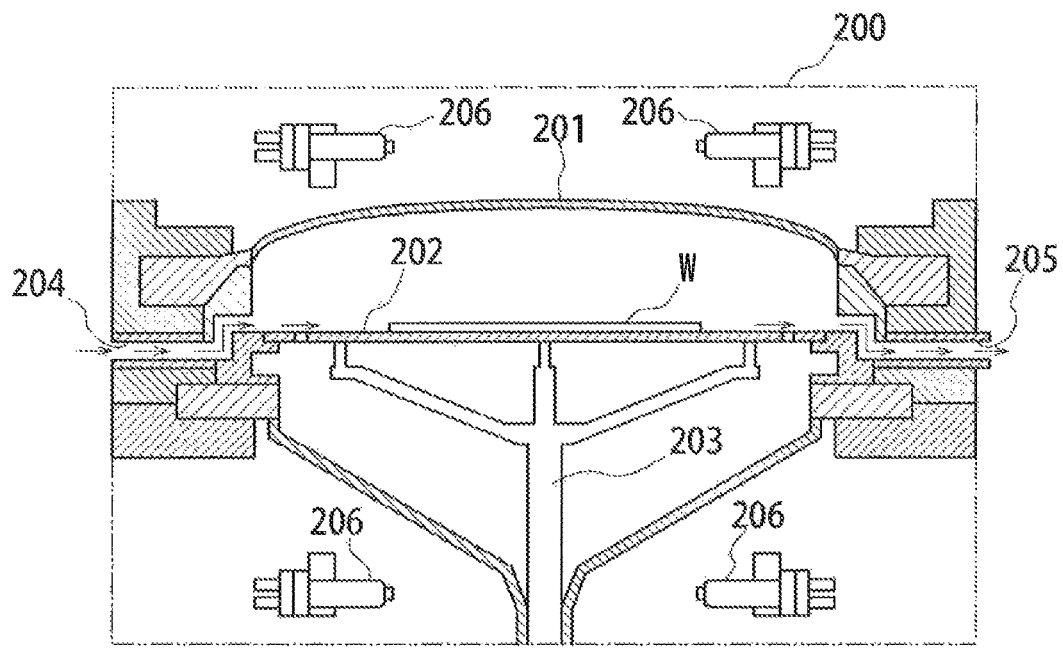
FIG. 1 is a schematic sectional view of a conventional single-wafer epitaxial growth apparatus.
Figure 2:
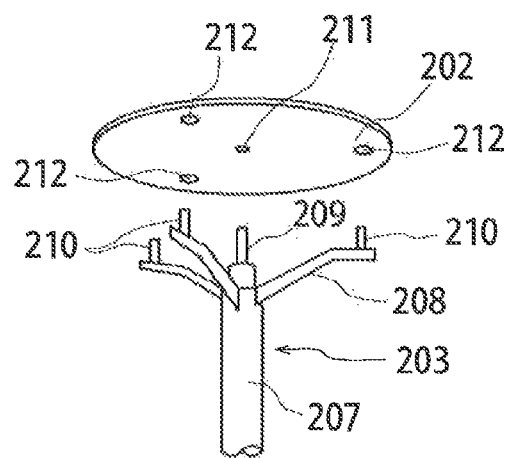
FIG. 2 is a schematic exploded perspective view showing details of a susceptor and a susceptor support shaft shown in FIG. 1.
Figure 3:
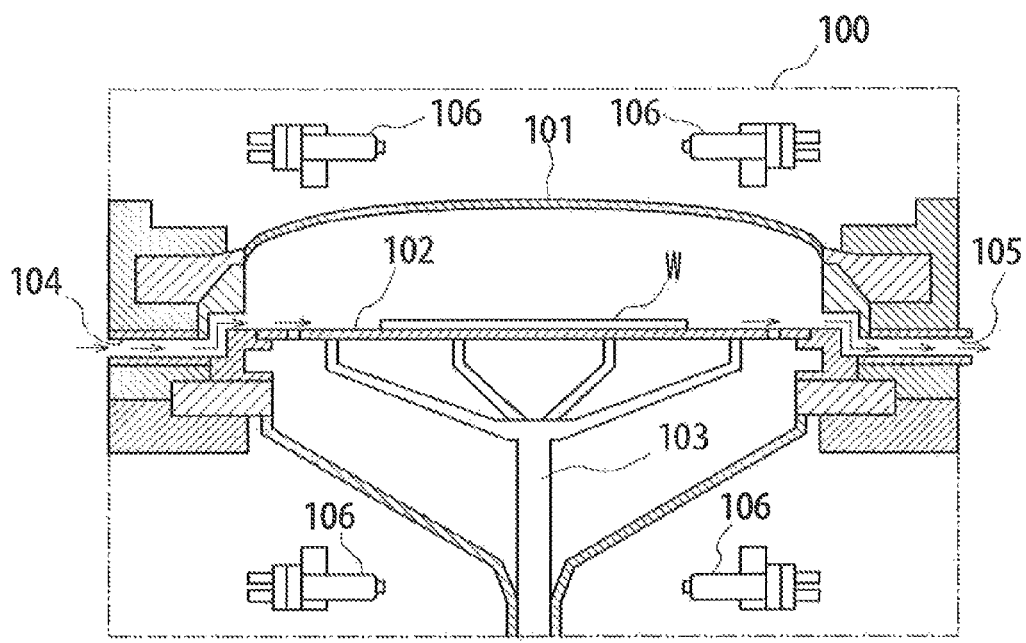
FIG. 3 is a schematic sectional view of an epitaxial growth apparatus according to the present invention.
Figure 4:
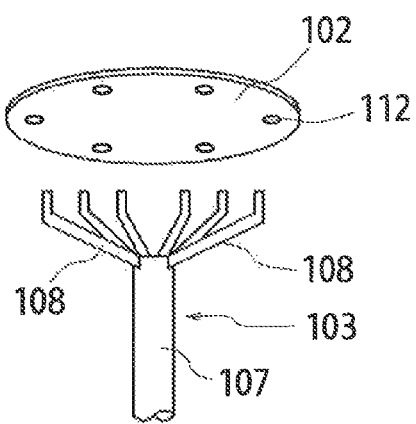
FIG. 4 is a schematic exploded perspective view showing details of a susceptor and a susceptor support shaft shown in FIG. 3.

An epitaxial growth apparatus 100 according to the present invention is, in an example shown in FIG. 3, an epitaxial growth apparatus for forming an epitaxial film on a semiconductor wafer W disposed within a chamber 101 having a supply port 104 and an exhaust port 105 for a treatment gas. The epitaxial growth apparatus 100 has a susceptor 102 for placing the semiconductor wafer W thereon within the chamber 101, and a susceptor support shaft 103 for supporting the susceptor 102 at an underneath portion of the susceptor 102. In one example shown in FIG. 4, the susceptor support shaft 103 has a support column 107 located substantially coaxial with the center of the susceptor 102 and at least four support arms 108 (six in FIG. 4) extending radially from the top end of the support column 107 at equal intervals therebetween.

It is preferable that a base material of the susceptor 102 is carbon graphite and a surface thereof is coated with silicon carbide. Although carbon graphite is excellent in thermal conductivity, heat-resistance and strength, it may contain occluded gas inside thereof and thus exhibit somewhat poor purity due to porosity thereof. Therefore, it is preferable to employ a configuration in which the surface of the susceptor 102 is coated with silicon carbide. Further, it is preferable to set the thickness of the susceptor 102 within the range of 20 to 40 mm. Although the thicker susceptor is the more effective in preventing deflection, a too thick susceptor has relatively large heat capacity, inevitably increasing time for the susceptor 102 to reach a predetermined temperature, which is not preferable. In a case where the susceptor is too thin, difference in an amount of released heat is conspicuous between the center portion and the outer peripheral portion of the susceptor 102, whereby temperature varies significantly in the radial direction and a magnitude of deflection increases, which is not preferable, either. A counter bore (not shown) for accommodating the semiconductor wafer when the wafer is placed thereon is formed on the surface of the susceptor 102.

Further, it is preferable that the susceptor support shaft 103 is made of quartz, especially by synthetic quartz. Quartz is excellent in heat-resistance and purity and easily transmits radiation from an infrared lamp, whereby the susceptor 102 can be uniformly heated.

Heating sources 106 are provided in an upper side region and a lower side region of the chamber 101. In general, a halogen lamp or an infrared lamp which is quickly heated/cooled and excellent in temperature controllability is preferably used as the heating sources 106.

In the epitaxial growth apparatus 100 according to the present invention, the susceptor support shaft 103 has at least four support arms. As described above, in the case of the conventional configuration having three support arms, the susceptor is deformed and deflected under a high temperature condition during heating of the semiconductor wafer W. The semiconductor wafer placed on the susceptor thus deflected is cooled by a gas entering into a space between the wafer and the susceptor, thereby making it difficult for a sufficiently thick epitaxial film to be grown thereon.

The larger the number of the support arms renders the distribution of film thickness at the central region of an epitaxial wafer the closer to a circle, which is effective in terms of obtaining uniform distributions of the film thickness and resistivity of an epitaxial film. However, too many support arms may result in failure in accurate detection of temperature on the rear surface of the susceptor by a pyrometer or may inhibit heat emitted from the heating sources located at the lower side of the chamber from being directly transmitted as radiant heat to the lower surface of the susceptor. Therefore, it is preferable to set the maximum provision number of the support arms at 12 or less.

According to the epitaxial growth method of the present invention using the epitaxial growth apparatus 100 described above, after the semiconductor wafer W is placed on the susceptor 102, the heating sources 106 are lit to heat the semiconductor wafer W. At the same time, a gas such as trichlorosilane ($SiHCl_3$) gas or dichlorosilane ($SiH_2Cl_2$) gas is introduced as the treatment gas from the supply port 104 into the chamber, while the treatment gas is exhausted from the exhaust port 105. As a result, the treatment gas flows in a laminar flow state along a surface of the semiconductor W which has been heated to a predetermined temperature, whereby a semiconductor of silicon epitaxially grows on the semiconductor wafer W.

Figure 5:
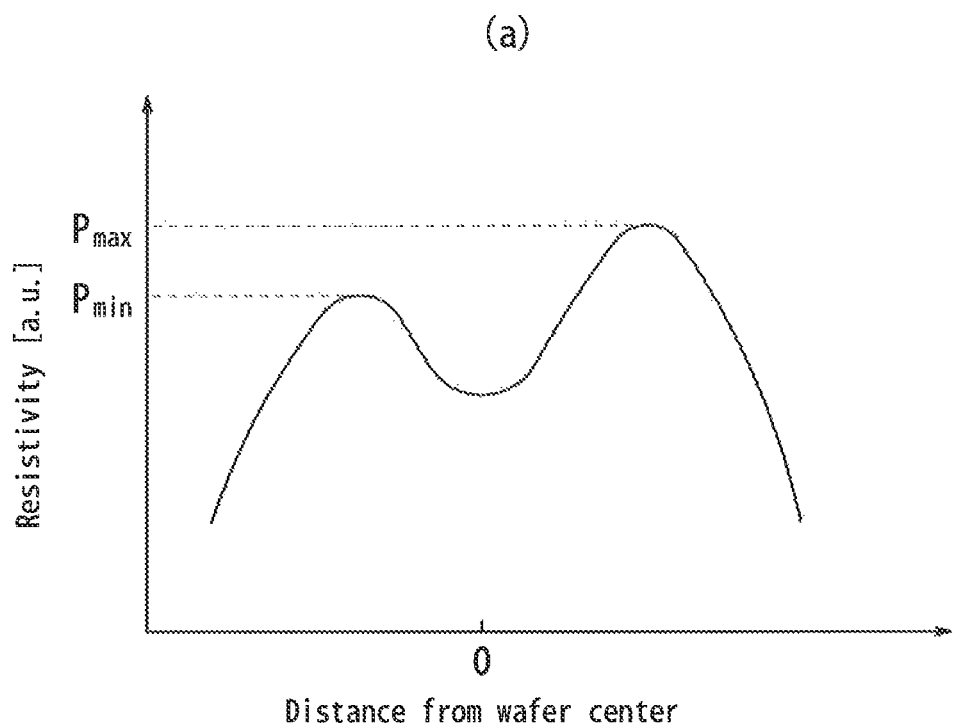
FIG. 5A is a profile of resistivity distribution for explaining non-uniformity of the resistivity distribution.
FIG. 5B is a schematic view showing directions in which the resistivity distribution is measured.
Figure 5:
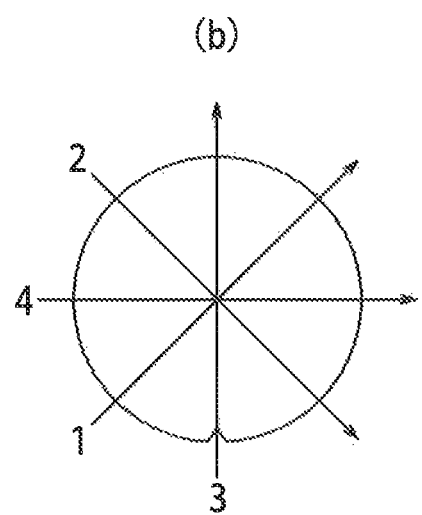

According to the epitaxial growth method of the present invention, non-uniformity of a resistivity distribution at a surface of an grown epitaxial film is 4.0% or less. In the present embodiment, "non-uniformity of a resistivity distribution" is obtained by: by measuring a resistivity distribution along a predetermined line (any of lines 1-4 in FIG. 5B) passing through the center of an epitaxial wafer (one example of measurement is shown in FIG. 5A); and calculating a value of $(P_{max}-P_{min})/(P_{max}+P_{min})\times100$, where the larger value is defined as $P_{max}$ and the smaller one is defined as $P_{min}$ of two peaks appearing in the measured resistivity distribution. The smaller value of $(P_{max}-P_{min})/(P_{max}+P_{min})\times100$ represents the smaller non-uniformity of the resistivity, i.e. the distribution is the more uniform. An average of the respective values obtained from the lines 1-4 is used for evaluation between wafers. In the present invention, an epitaxial wafer whose non-uniformity in a resistivity distribution is 4.0% or less is evaluated as "high quality" having a uniform resistivity distribution.

The foregoing descriptions merely illustrate one example of embodiments of the present invention, and various modifications may be made thereto within the scope of the present invention defined by accompanying claims.

EXAMPLES

Example 1

An epitaxial growth process is carried out by using an epitaxial growth apparatus having six support arms radially extending from the top end of a support column with equal intervals therebetween, as shown in FIG. 3. Specifically, a P-type single crystal silicon wafer having a diameter of 300 mm, a plane direction (100) and a specific resistance of 10 Ω·cm is subjected to hydrogen bake for 60 seconds at 1130° C. and then a reaction gas mixture, produced by diluting $SiHCl_3$ as a silicon source and $B_2H_6$ as a boron dopant source with hydrogen gas, is supplied into the chamber 101 of the epitaxial growth apparatus 100, whereby a P-type epitaxial silicon wafer film having thickness of about 2 μm and specific resistance of 15 Ω·cm is grown at a growth temperature of 1130° C. The susceptor 102 has a diameter of 360 mm and is formed by carbon graphite whose surface is coated with silicon carbide. The support column and the support arms are made of quartz glass.

Further, the susceptor and the respective arms are in contact with each other at positions 178 mm distant from the center of the susceptor.

Example 2

An epitaxial wafer is obtained by using an apparatus similar to the apparatus of Example 1, which apparatus of Example 2 differs from the apparatus of Example 1 only in that the former has four support arms.

Example 3

An epitaxial wafer is obtained by using an apparatus similar to the apparatus of Example 1, which apparatus of Example 3 differs from the apparatus of Example 1 only in that the former has nine support arms.

Comparative Example

An epitaxial wafer is obtained by using an apparatus similar to the apparatus of Example 1, which apparatus of Comparative Example differs from the apparatus of Example 1 only in that the former has three support arms.

(Evaluation 1)

Figure 6:
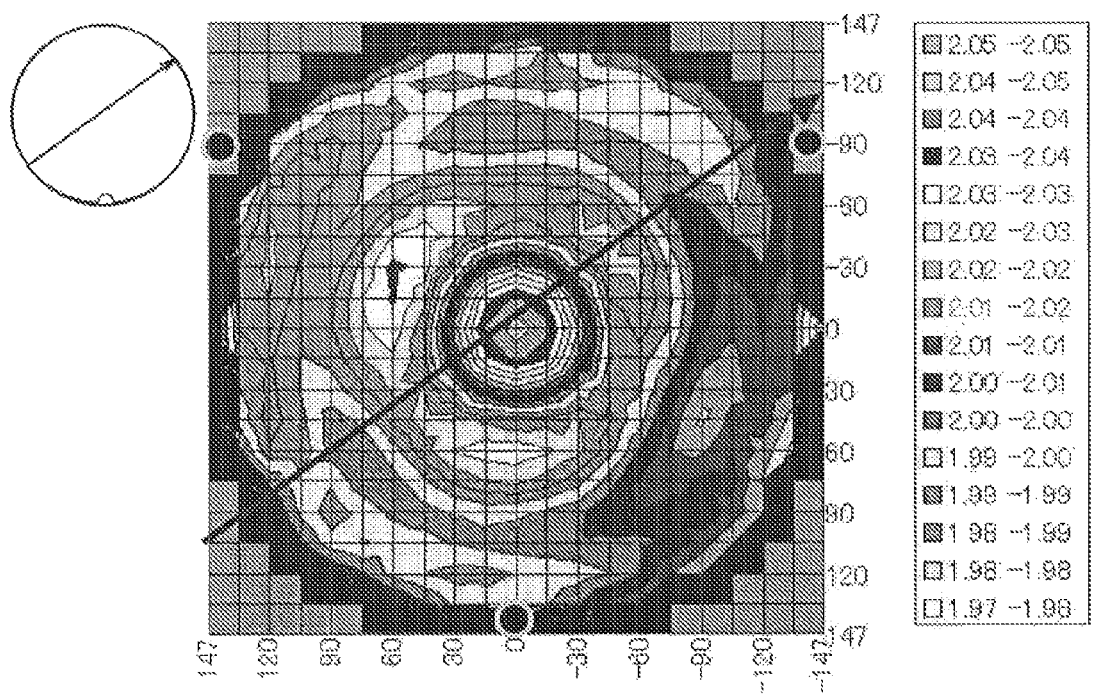
FIG. 6 is a multi-point three-dimensional map of film thickness of an epitaxial wafer according to Comparative Example.
Figure 7:
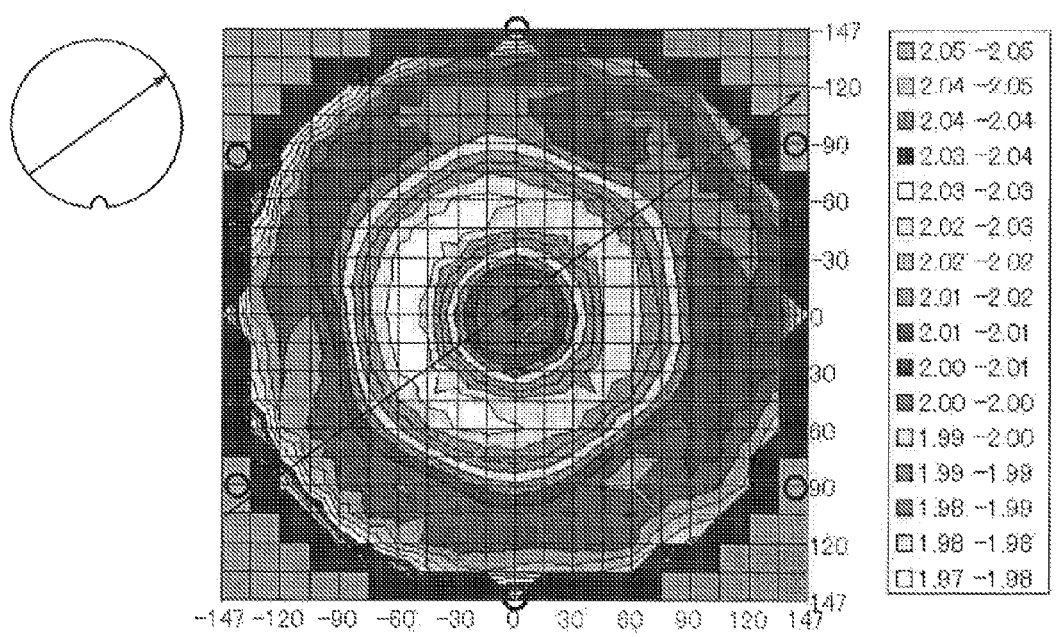
FIG. 7 is a multi-point three-dimensional map of film thickness of an epitaxial wafer according to Example 1.

A multi-point three-dimensional map of film thickness of an epitaxial wafer is prepared for the epitaxial wafers according to Example 1 and Comparative Example, respectively. FIG. 6 shows a multi-point three-dimensional map of film thickness of the epitaxial wafer formed by growing an epitaxial film on a semiconductor wafer on a susceptor supported by a susceptor support shaft having three support arms according to Comparative Example. FIG. 7 shows a multi-point three-dimensional map of film thickness of an epitaxial wafer formed by growing an epitaxial film on a semiconductor wafer on a susceptor supported by a susceptor support shaft having six support arms according to Example 1. These three-dimensional maps are prepared based on measurements by using an FT-IR device ("QS-3300" manufactured by Nanometrics Incorporated). Note that positions of the symbol "⊚" plotted on the outer side of the three-dimensional map of the wafer in each of FIG. 6 and FIG. 7 represent positions where the susceptor is in contact with the support arms, respectively.

In Comparative Example (i.e. an epitaxial wafer obtained through an epitaxial growth process during which a susceptor is supported by three support arms), it is understood from FIG. 6 that the epitaxial film is relatively thick in a substantially triangular region corresponding to a triangle formed by connecting respective contact points of the three support arms with the susceptor and the epitaxial film is relatively thin in the vicinities of the halfway point of each side connecting two contact points of the support arms with the susceptor, of the triangle. This is because the magnitude of deflection of the susceptor is relatively large in the outer peripheral portions of the susceptor each located between the respective contact points of the support arms with the susceptor.

In contrast, In Example 1 (i.e. an epitaxial wafer obtained through an epitaxial growth process during which a susceptor is supported by six support arms), it is understood from FIG. 7 that the epitaxial film is relatively thick in a substantially hexagonal region corresponding to a hexagon formed by connecting respective contact points of the six support arms with the susceptor and that the region where the epitaxial film is relatively thin has decreased, as compared with the case where the susceptor is supported by three support arms.

(Evaluation 2)

Figure 8:
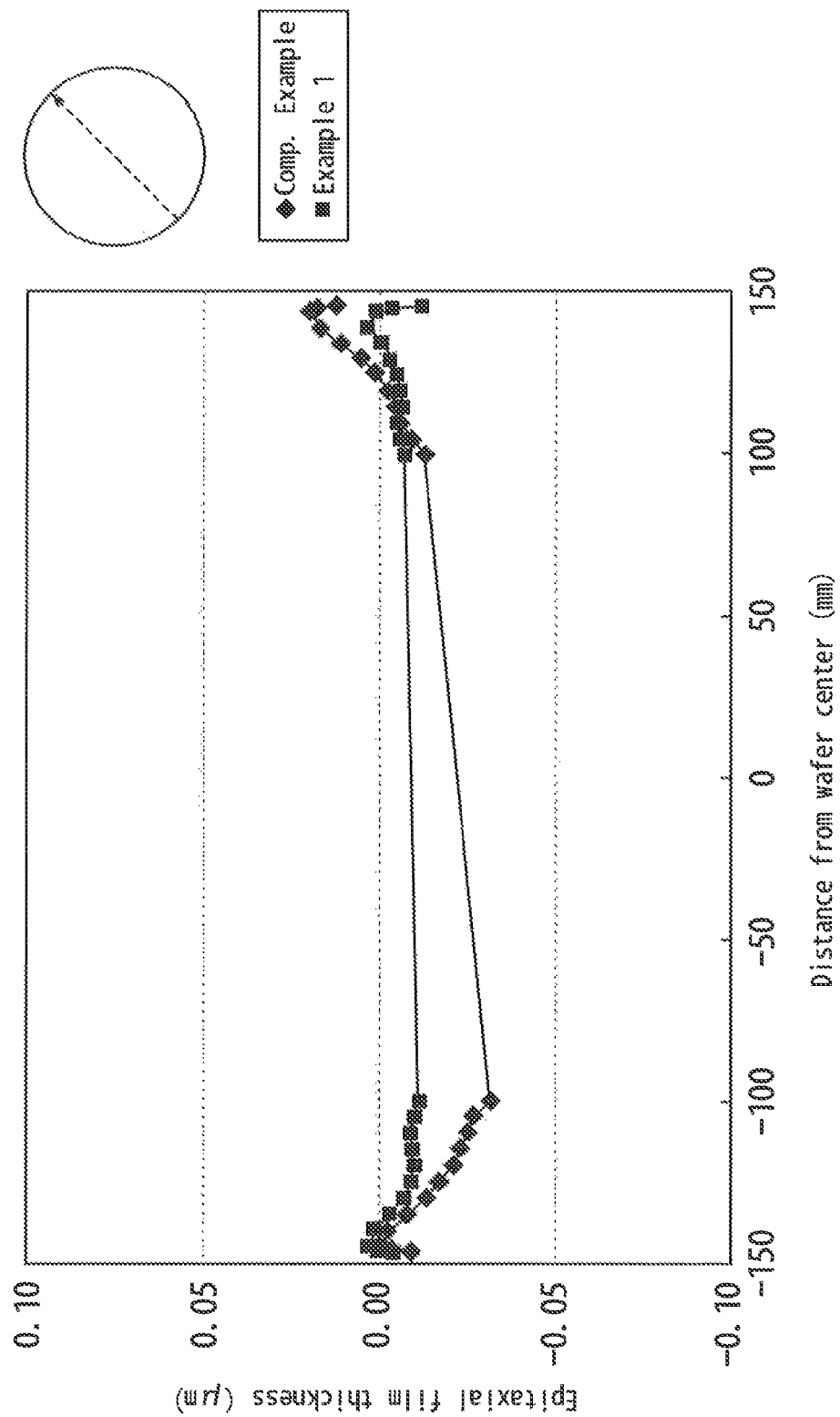
FIG. 8 is a profile of epitaxial film thickness in the radial direction of an epitaxial wafer in Comparative Example and Example 1.
Figure 9:
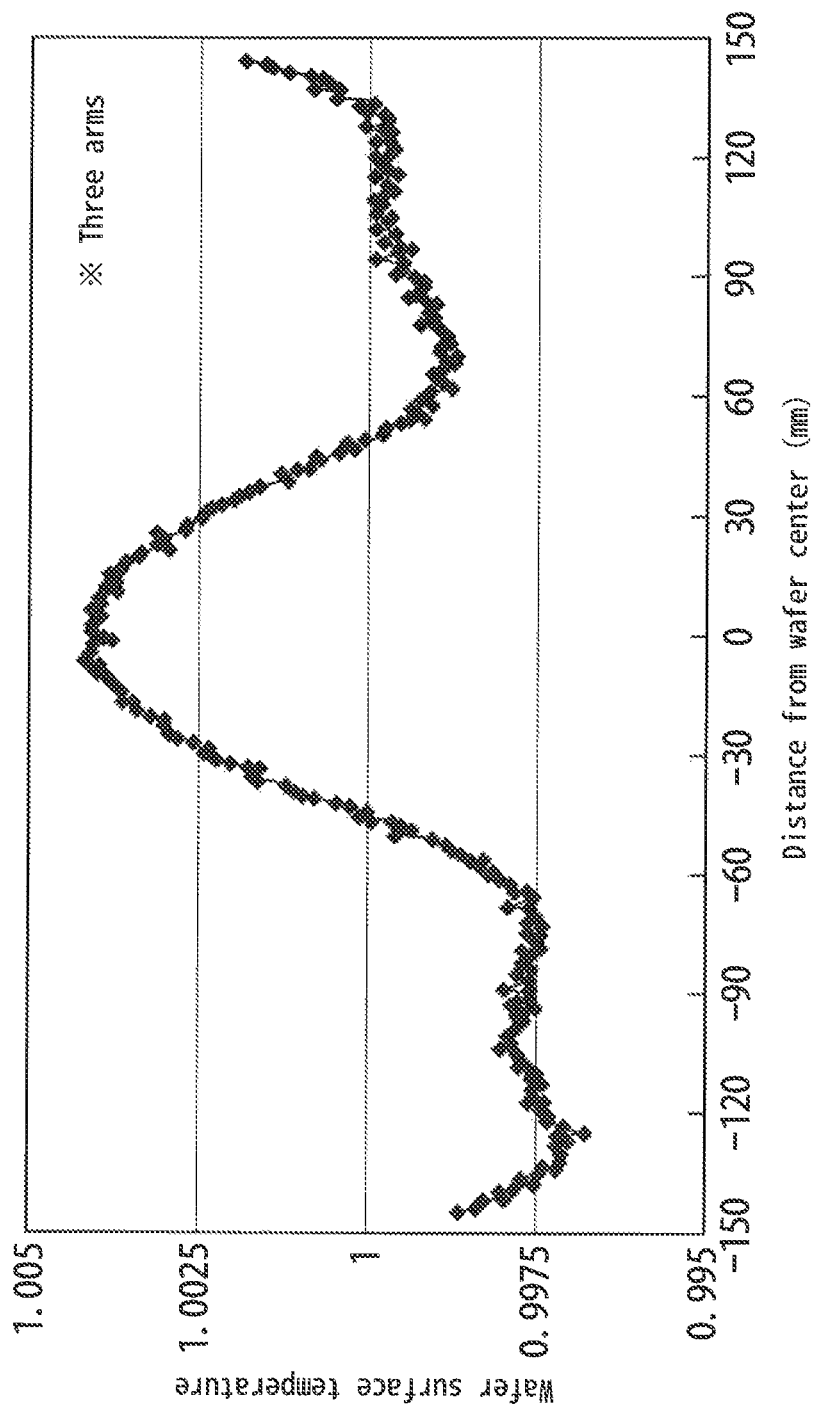
FIG. 9 is a profile in which haze has been converted into wafer surface temperature to express a growth temperature distribution in the wafer of Comparative Example.
Figure 10:
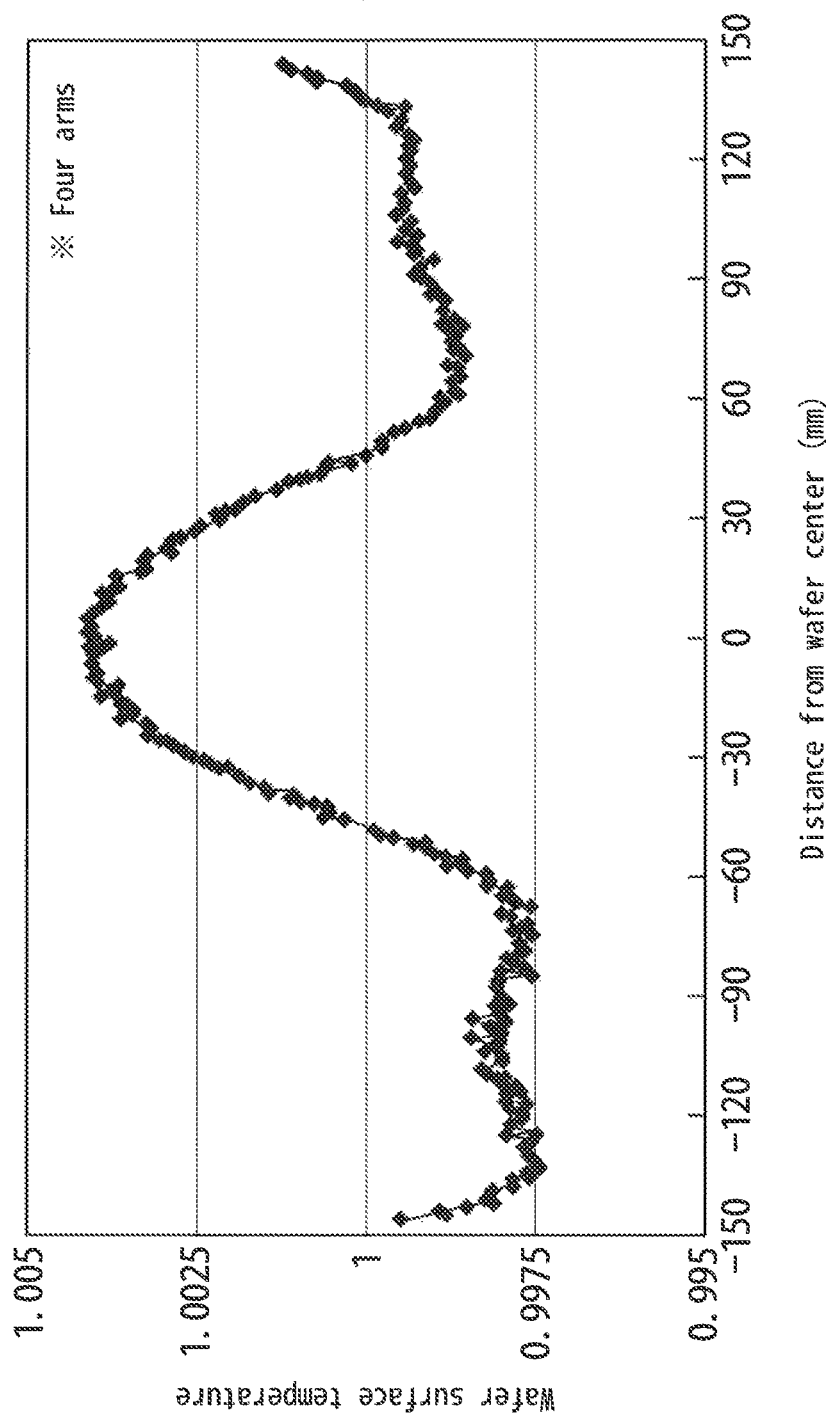
FIG. 10 is a profile in which haze has been converted into wafer surface temperature to express a growth temperature distribution in the wafer of Example 1.
Figure 11:
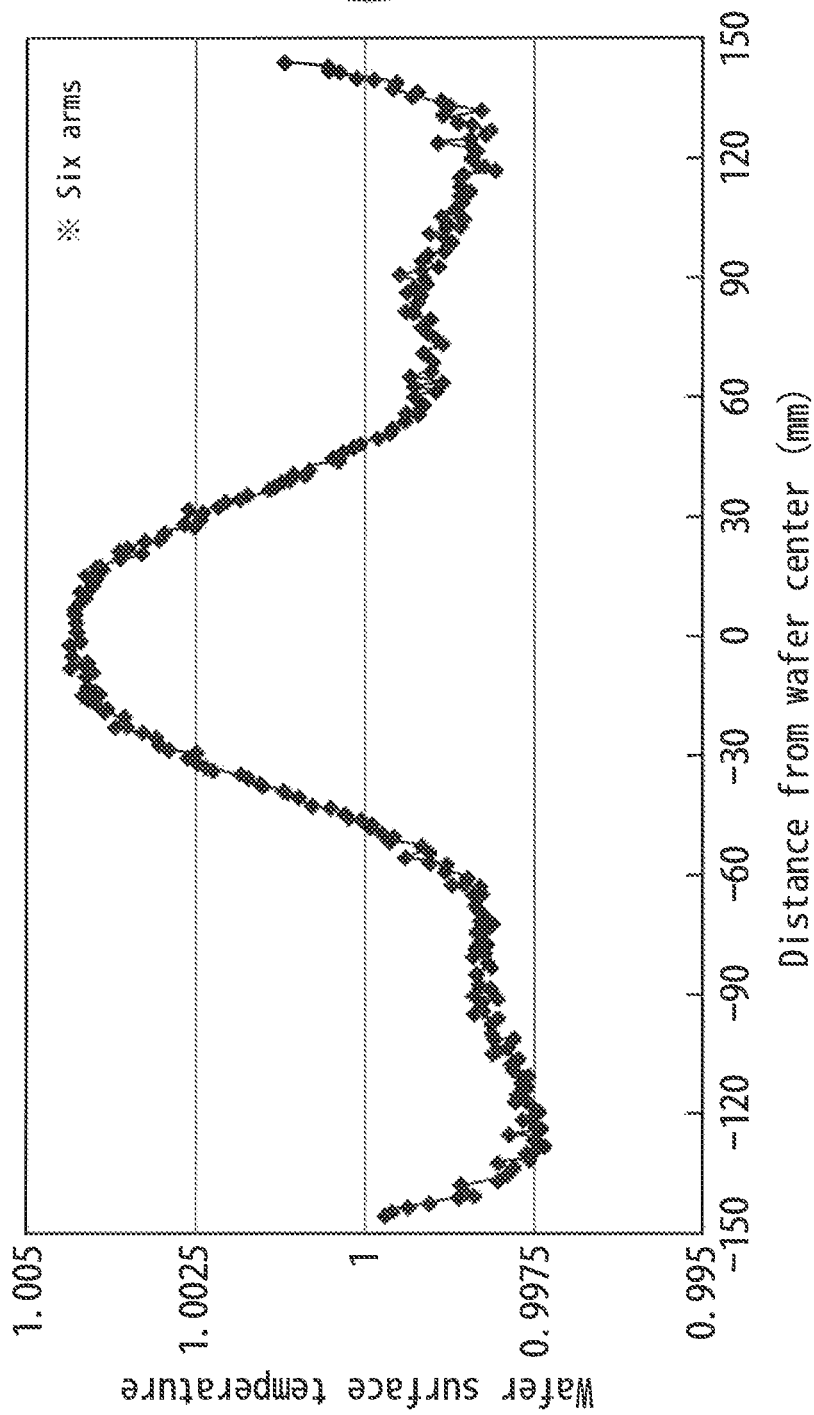
FIG. 11 is a profile in which haze has been converted into wafer surface temperature to express a growth temperature distribution in the wafer of Example 2.
Figure 12:
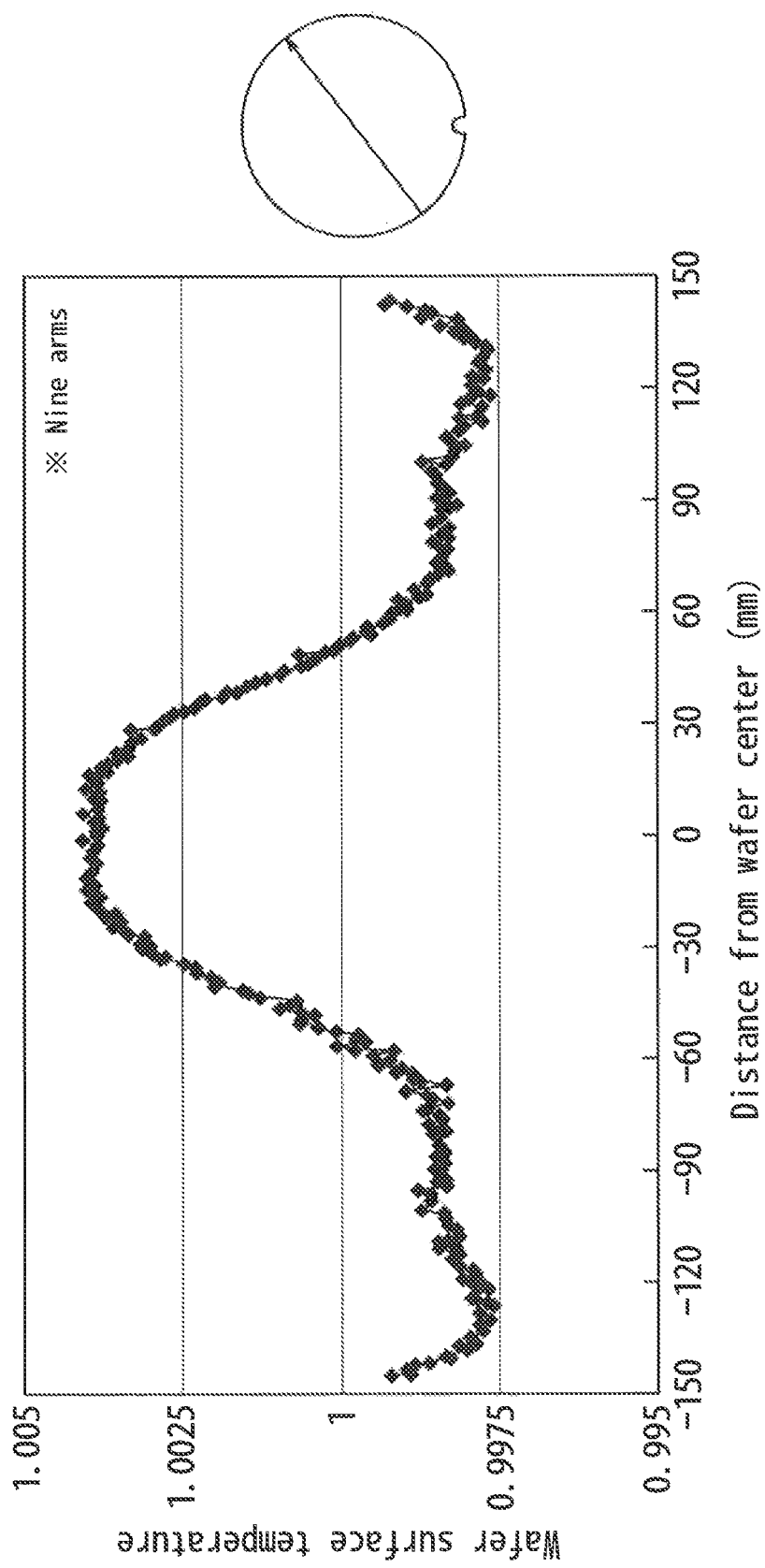
FIG. 12 is a profile in which haze has been converted into wafer surface temperature to express a growth temperature distribution in the wafer of Example 3.

Profiles of the epitaxial wafer thickness in the wafer radial direction are investigated for the epitaxial wafers of Example 1 and Comparative Example, respectively. The results are shown in FIG. 8. The FT-IR device ("QS-3300" manufactured by Nanometrics Incorporated) is used for the investigation.

FIG. 8 shows a profile of epitaxial film thickness in a wafer radial direction (a direction indicated by an arrow) of each of the wafers shown in FIG. 6 and FIG. 7 in a range 100-150 mm distant from the center of the wafer. Specifically, the thickness at each epitaxial wafer center is defined as 0 and the variation in thickness from the "zero" thickness in each wafer is profiled. Note that each solid line in FIG. 8 is drawn to indicate an inclination of the corresponding thickness profile. As is clearly understood from FIG. 8, the inclination of thickness profile in Example 1 (six support arms) is gentler that that in Comparative Example (three support arms).

(Evaluation 3)

For each of the epitaxial wafers according to Examples 1-3 and Comparative Example, haze at a surface thereof is observed and converted into the corresponding growth temperature. FIG. 9 to FIG. 12 show in-plane temperature profiles of the epitaxial wafers of Comparative Example and Examples 1-3, respectively. The observation of haze is carried out by using a surface inspection device ("SP-1", manufactured by KLA-Tencor Corporation), and the conversion of the observed haze into the temperature is made based on a conversion formula obtained through experiments (in each of FIG. 9 to FIG. 12, the Y-axis represents the epitaxial growth temperature expressed as a ratio with respect to the average value of temperatures measured at respective measurement points). As can be understood from FIG. 9, the gradient in the temperature distribution curve is relatively large in the epitaxial wafer of Comparative Example formed by using the conventional epitaxial growth apparatus having three support arms. In contrast, as is understood from FIG. 10 to FIG. 12, the gradient in the temperature distribution curve is relatively small in the epitaxial wafer of each of Examples 1 to 3.

(Evaluation 4)

Figure 13:
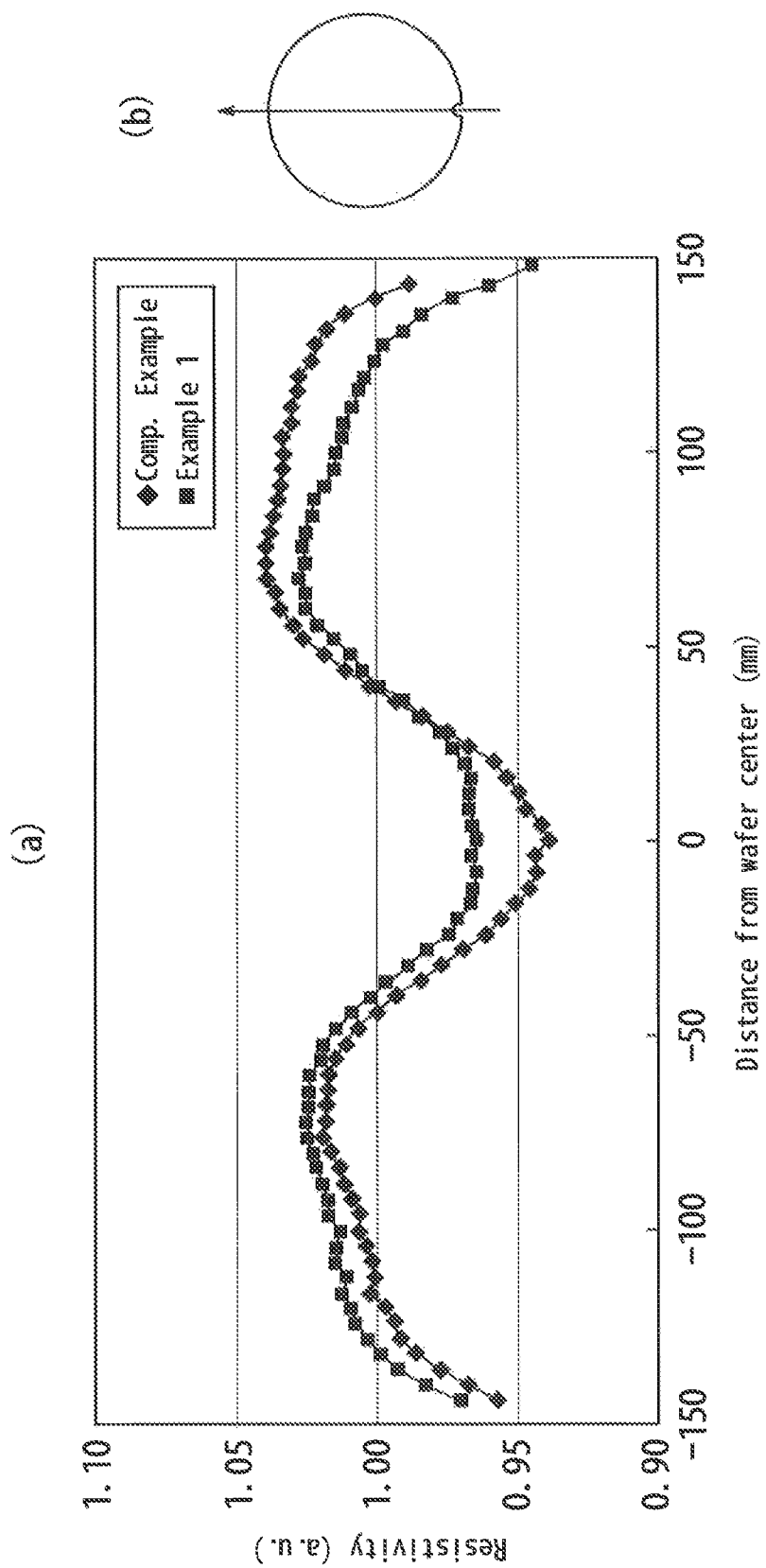
FIG. 13A is a profile of resistivity distributions of epitaxial wafers according to Comparative Example and Example 1.
FIG. 13B is a schematic diagram showing a direction in which the resistivity distributions of FIG. 13A are measured.
Figure 14:
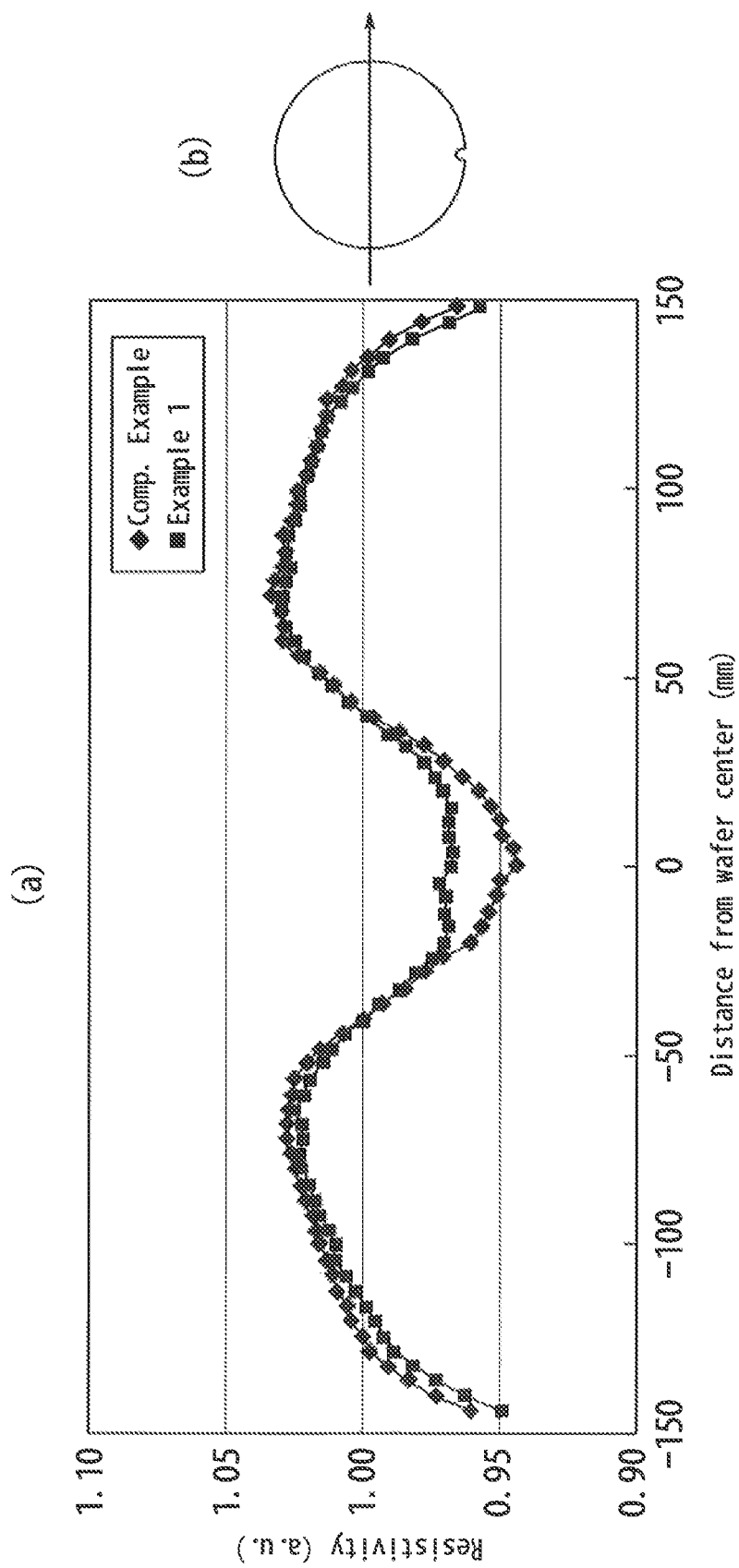
FIG. 14A is another profile of resistivity distributions of the epitaxial wafers according to Comparative Example and Example 1.
FIG. 14B is a schematic diagram showing a direction in which the resistivity distributions of FIG. 14A are measured.
Figure 15:
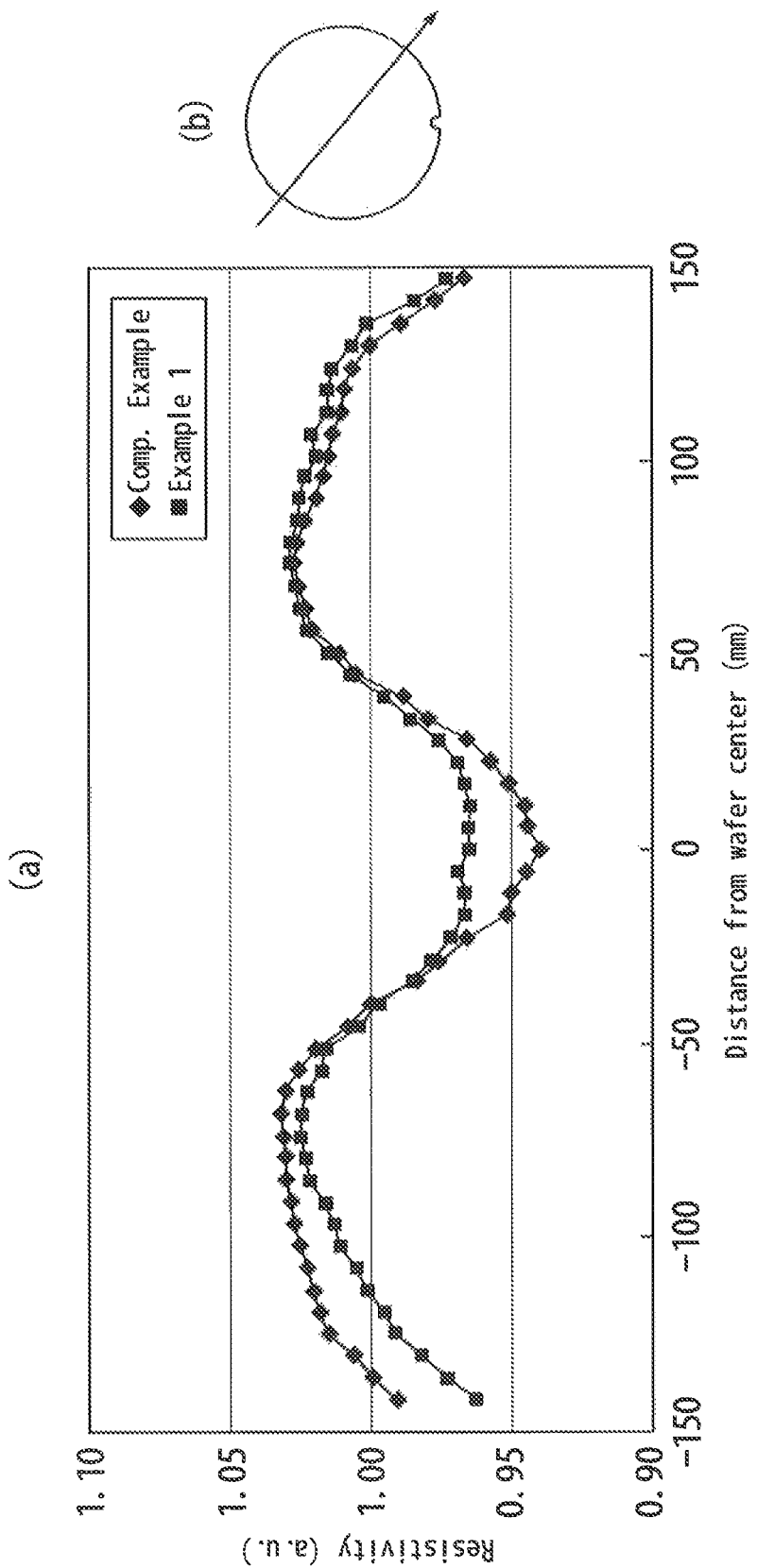
FIG. 15A is yet another profile of resistivity distributions of the epitaxial wafers according to Comparative Example and Example 1.
FIG. 15B is a schematic diagram showing a direction in which the resistivity distributions of FIG. 15A are measured.
Figure 16:
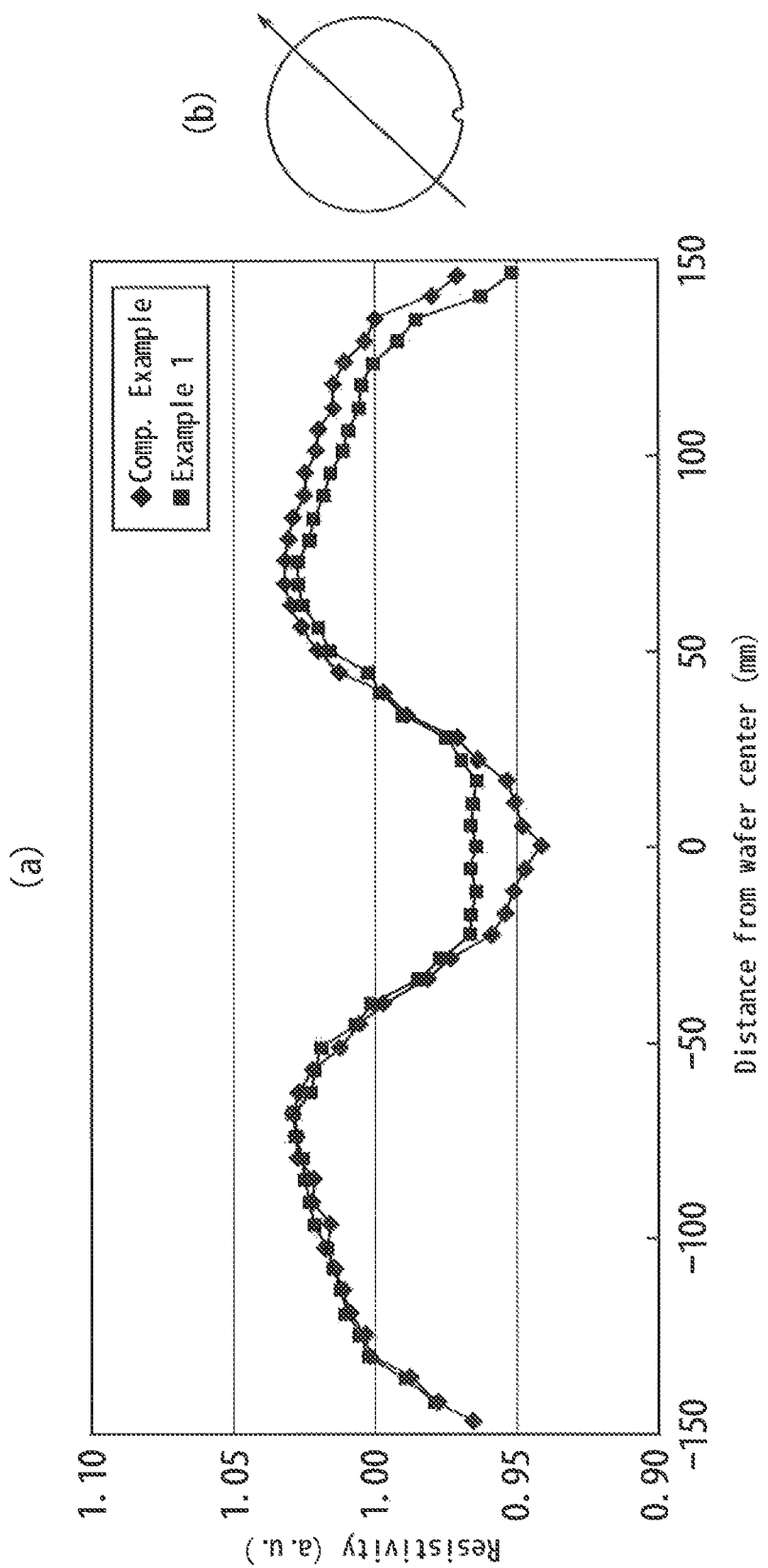
FIG. 16A is yet another profile of resistivity distributions of the epitaxial wafers according to Comparative Example and Example 1.
FIG. 16B is a schematic diagram showing a direction in which the resistivity distributions of FIG. 16A are measured.

For each of the epitaxial wafers according to Examples 1-3 and Conventional Example, resistivity is measured. The measurement is made by using an SPV measurement device ("QCS-7300R" manufactured by SEMILAB Co. Ltd.). FIG. 13A shows profiles of resistivity distributions in the epitaxial wafers according to Comparative Example and Example 1. FIG. 13B is a diagram showing the direction in which resistivity of the epitaxial wafer in FIG. 13A is measured. As is understood from FIG. 13A, there is observed much more variation in the resistivity distribution of the epitaxial wafer according to Comparative Example formed by using the conventional epitaxial growth apparatus having three support arms than in the resistivity distribution of the epitaxial wafer according to Example 1 formed by using the epitaxial growth apparatus having six support arms according to the present invention. FIGS. 14A and 14B to FIGS. 16A and 16B show the results of measurements conducted in the same manner as the measurement shown in FIGS. 13A and 13B, except that a direction in which resistivity of each epitaxial wafer is measured is changed for each measurement. It is confirmed that in each of the measurement directions shown in FIGS. 14B, 15B and 16B variation in the resistivity distribution is smaller in Example 1 than in Comparative Example.

(Evaluation 5)

Figure 17:
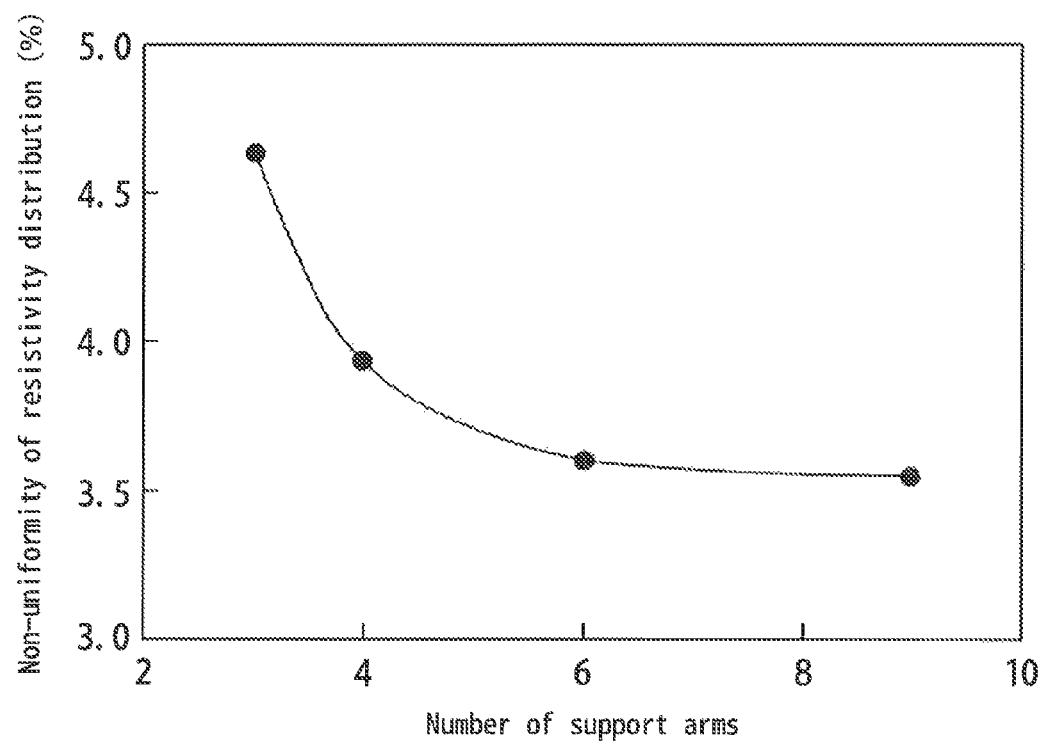
FIG. 17 is a graph plotting calculation results of non-uniformity in the resistivity distribution for each number of support arms.

FIG. 17 shows the calculation results of non-uniformity in each of resistivity distributions of the epitaxial wafers obtained in Comp. Example and Examples 1 to 3. In FIG. 17, the X-axis represents the number of support arms and the Y-axis represents the non-uniformity in resistivity distribution. Note that each non-uniformity value in resistivity distribution in FIG. 17 is the average of the respective (($P_{max}-P_{min}$)/($P_{max}+P_{min}$)×100) values obtained in the FIG. 13B, FIG. 14B, FIG. 15B and FIG. 16B measurements. From FIG. 17, it is understood that it is possible to decrease non-uniformity in resistivity distribution of an epitaxial wafer to 4.0% or less by using the device having four or more support arms according to the present invention.

INDUSTRIAL APPLICABILITY

According to the epitaxial growth apparatus and the epitaxial growth method of the present invention, it is possible to suppress deflection of a susceptor for placing a semiconductor wafer thereon, decrease variation in the in-plane temperature of the semiconductor wafer, and thus produce an epitaxial wafer of high quality by providing at least four support arms in a susceptor support shaft that supports the susceptor at an underneath portion of the susceptor.

What is claimed is:

1. An epitaxial growth method of forming an epitaxial film on a semiconductor wafer, comprising:
    placing a semiconductor wafer on a susceptor in a chamber such that the semiconductor wafer can be exposed to a treatment gas, the susceptor being supported at an underneath portion thereof by a susceptor support shaft having support arms extending radially from a top end of a support column; and
    selecting the number of the support arms to be six to twelve such that the non-uniformity of a resistivity distribution at a surface of a grown epitaxial film is less than 5% in any line or measurement direction, provided that non-uniformity of the resistivity distribution is obtained by measuring a resistivity distribution along a line passing through the center of an epitaxial wafer and calculating a value of $(P_{max}-P_{min})/(P_{max}+P_{min})\times 100$, where the larger value is defined as $P_{max}$ and the smaller one is defined as $P_{min}$ of two peaks appearing in the measured resistivity distribution along the line,
    wherein the top end of the support column is distanced from the underneath portion of the susceptor via the support arms therebetween,
    the susceptor has no through holes in an area thereof to be in contact with the wafer, and
    the average of values of the non-uniformity of resistivity distribution at the surface of the grown epitaxial film obtained at the respective lines thereof is 4.0% or less.

2. The epitaxial growth method of claim 1, wherein the support column is located substantially coaxial with the center of the susceptor.

3. The epitaxial growth method of claim 1, wherein the support arms have equal intervals therebetween.

4. The epitaxial growth method of claim 1, wherein the chamber has a supply port and an exhaust port for the treatment gas.

5. The epitaxial growth method of claim 1, wherein the susceptor is made of carbon graphite whose surface is coated with silicon carbide.

6. The epitaxial growth method of claim 1, wherein the susceptor support shaft is made of quartz.

7. The epitaxial growth method of claim 1, wherein growing the epitaxial film comprises:
    heating the semiconductor wafer disposed on the susceptor;
    introducing the treatment gas into the chamber via a supply port; and
    removing the treatment gas from the chamber via an exhaust port.

8. The epitaxial growth method of claim 7, wherein the treatment gas flows in a laminar state along a surface of the heated semiconductor wafer.

9. The epitaxial growth method of claim 7, wherein heating the semiconductor wafer comprises activating at least one heating source located above the semiconductor wafer and at least one heating source located below the susceptor.

10. An epitaxial growth method of forming an epitaxial film on a semiconductor wafer, comprising:
    placing an individual semiconductor wafer on a susceptor of a single-wafer epitaxial growth apparatus, the susceptor being in a chamber such that the semiconductor wafer can be exposed to a treatment gas and the susceptor being supported at an underneath portion thereof by a susceptor support shaft having support arms extending radially from a top end of a support column; and
    selecting the number of the support arms to be six to twelve such that the non-uniformity of a resistivity distribution at a surface of a grown epitaxial film is less than 5% in any line or measurement direction, provided that non-uniformity of the resistivity distribution is obtained by measuring a resistivity distribution along a line passing through the center of an epitaxial wafer and calculating a value of $(P_{max}-P_{min})/(P_{max}+P_{min})\times 100$, where the larger value is defined as $P_{max}$ and the smaller one is defined as $P_{min}$ of two peaks appearing in the measured resistivity distribution along the line,
    wherein the susceptor has no through holes in an area thereof to be in contact with the wafer, and
    the average of values of the non-uniformity of resistivity distribution at the surface of the grown epitaxial film obtained at the respective lines thereof is 4.0% or less.

11. The epitaxial growth method of claim 1, further comprising selecting the number of the support arms such that, in a profile of epitaxial film thickness in the grown epitaxial film in a radial direction of the wafer in a range 100-150 mm distant from the center of the wafer, provided that the thickness at each epitaxial wafer center is defined as 0, a variation in thickness from the "zero" thickness in the wafer is within ±0.02 μm.

12. The epitaxial growth method of claim 10, further comprising selecting the number of the support arms such that, in a profile of epitaxial film thickness in the grown epitaxial film in a radial direction of the wafer in a range 100-150 mm distant from the center of the wafer, provided that the thickness at each epitaxial wafer center is defined as 0, a variation in thickness from the "zero" thickness in the wafer is within ±0.02 μm.

13. The epitaxial growth method of claim 1, wherein the number of the support arms is selected such that, in a multipoint three-dimensional map of film thickness of the epitaxial wafer, a difference in thickness between respective contact points of the support arms with the susceptor and the vicinity of the halfway point between adjacent contact points of the support arms with the susceptor is decreased relative to a wafer placed on a susceptor in the chamber and supported at an underneath portion thereof by a susceptor support shaft having only three support arms extending radially from a top end of a support column.

14. The epitaxial growth method of claim 10, wherein the number of the support arms is selected such that, in a multipoint three-dimensional map of film thickness of the epitaxial wafer, a difference in thickness between respective contact points of the support arms with the susceptor and the vicinity of the halfway point between adjacent contact points of the support arms with the susceptor is decreased relative to a wafer placed on a susceptor in the chamber and supported at an underneath portion thereof by a susceptor support shaft having only three support arms extending radially from a top end of a support column.

* * * * *